United States Patent [19]

Knippelmier

[11] 4,032,841
[45] June 28, 1977

[54] METHOD AND APPARATUS FOR MEASURING THE CAPACITANCE OF TELEPHONE CABLE PAIRS

[75] Inventor: Gary H. Knippelmier, Round Rock, Tex.

[73] Assignee: A. P. C. Industries, Inc., Austin, Tex.

[22] Filed: Nov. 28, 1975

[21] Appl. No.: 636,309

[52] U.S. Cl. .............................. 324/60 CD; 324/52
[51] Int. Cl.² ........................................ G01R 27/26
[58] Field of Search .............. 324/60 CD, 52, 60 C, 324/60 R

[56] References Cited

UNITED STATES PATENTS

| 2,208,655 | 7/1940 | Wright | 324/60 CD |
| 3,452,272 | 6/1969 | Collins et al. | 324/60 CD |

Primary Examiner—Stanley T. Krawczewicz
Attorney, Agent, or Firm—Wofford, Felsman, Fails & Zobal

[57] ABSTRACT

Improved method and apparatus for measuring the capacitance of telephone cable pairs utilizes the technique of charging and discharging the cable pair being measured to respective predetermined voltage levels and integrating the discharge current while observing certain specified parameter requirements. This technique provides an output which is a linear function of the capacitance of the cable pair being measured and has the property of substantially infinite rejection of a predetermined (interference) frequency and its harmonics, and yet permits the apparatus to have requisite simplicity and economy.

6 Claims, 4 Drawing Figures

METHOD AND APPARATUS FOR MEASURING THE CAPACITANCE OF TELEPHONE CABLE PAIRS

FIELD OF THE INVENTION

The invention relates to improved method and apparatus for measuring the capacitance of telephone cable pairs.

BACKGROUND OF THE INVENTION

It is a common practice to measure the capacitance of telephone cable pairs, the capacitance measurement being utilized primarily to identify and locate various types of telephone cable faults. The most commonly used apparatus for this purpose is of the Wheatstone bridge type. Such bridge apparatus has the disadvantages of requiring manual adjustment to balance for each measurement; the measured values must be manually modified by correction factors for cable pair lengths above 1/20 of the wave length of the test frequency; it is not effective to distinguish some faults for cable pair lengths approaching ¼ of the test frequency wave length. Other types of available apparatus either are susceptible to errors due to interference (primarily from power lines) or have severe limitations due to non-linearity.

The general object of this invention is to provide improved method and apparatus for measuring the capacitance of telephone cable pairs.

More specifically, it is an object of the invention to provide method and apparatus for measuring the capacitance of telephone cable pairs, which apparatus has an output which is a linear function of the capacitance measured and has the property of substantially infinite rejection of a predetermined frequency and its harmonics, and yet which has requisite simplicity and economy.

For a further understanding of the invention and further objects, features, and advantages thereof, reference may now be had to the following description, taken in conjunction with the accompanying drawing.

BRIED DESCRIPTION OF THE DRAWING

SUMMARY OF THE INVENTION

In accordance with the invention, there is provided method and apparatus for measuring the capacitance of telephone cable pairs, which apparatus has an output that is a linear function of the capacitance measured and has the property of substantially infinite rejection of a predetermined frequency and its harmonics, and yet has requisite simplicity and economy. The apparatus comprises suitable means for charging a selected telephone cable pair, the capacitance of which is to be measured, to a first predetermined voltage; suitable means for discharging the cable pair from the first predetermined voltage to a second predetermined voltage; and suitable means for integrating the discharge current. The charging resistance is made equal to the discharging resistance and the discharging time is made equal to the period of the interference frequency to be rejected. Further, the charging time is at least 5 times the time constant of the charging resistance plus the resistance and capacitance of the selected cable pair, and the discharge time is at least five times the time constant of the discharging resistance plus the resistance and capacitance of the selected cable pair. As a result, an output voltage is produced which is a linear function of the capacitance of the selected cable pair.

DESCRIPTION OF PREFERRED EMBODIMENT

Figure 1:
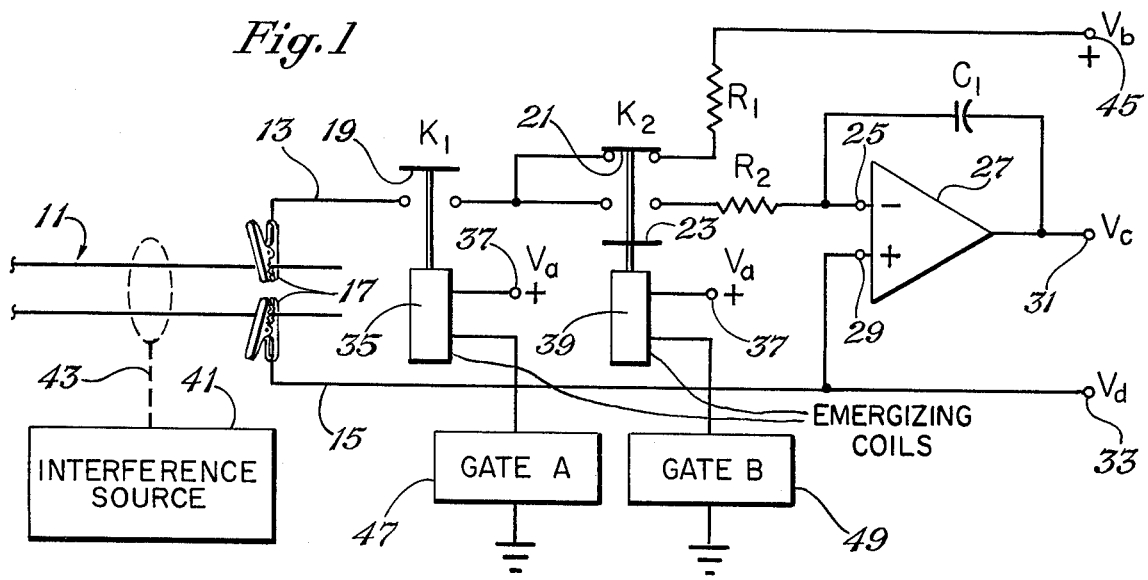
FIG. 1 is a schematic electrical circuit diagram showing apparatus for measuring the capacitance of a telephone cable pair in accordance with a preferred embodiment of the invention.
Figure 2:
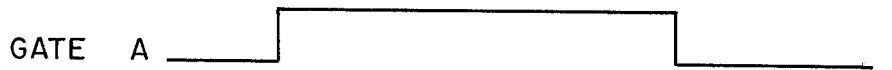
FIG. 2 is a graph to aid in explanation of the operation of the apparatus of FIG. 1.
Figure 2:
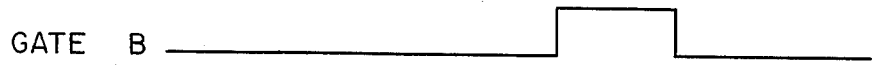
Figure 2:
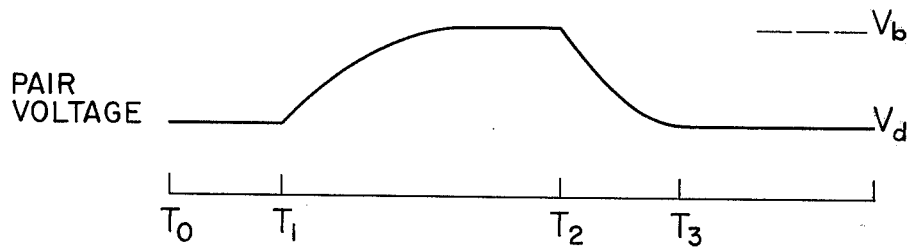
Figure 3:
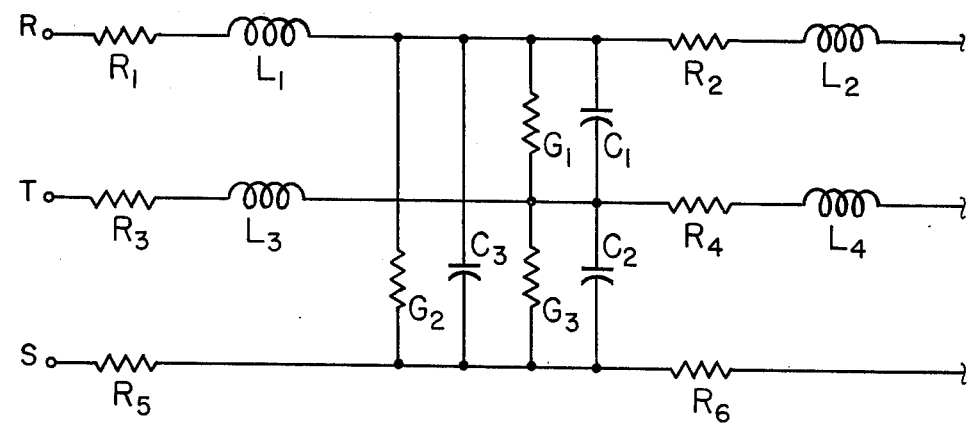
FIG. 3 is a schematic diagram showing the electrical equivalent of a typical telephone cable pair.

For a description of a preferred embodiment of the invention and explanation of the operation of the apparatus, reference is made to FIGS. 1–3 of the drawing. In FIG. 1, there is shown a typical telephone cable pair 11 to which the input leads 13 of the capacitance measuring apparatus is connected by suitable means, shown as alligator clips 17. The lead 13 is connected in series with a normally open contact 19 of a relay $K_1$, a normally closed contact 21 of a relay $K_2$, and a charging resistance $R_1$ to a terminal 45 of a direct power source (not shown) at which voltage $V_b$ is present. The lead 13 is also connected in series with normally open contact 19 and a normally open contact 23 of relay $K_2$ and a discharging resistor $R_2$ to a first terminal 25 of an operational amplifier 27. The lead 15 is connected to a second terminal 29 of the operational amplifier 27 and also to a terminal 33 at which the voltage $V_d$ appears. The operational amplifier 27 has a third terminal 31 at which an output voltage $V_c$ appears. A capacitor $C_1$ is connected in parallel with the first and third terminals 25, 31 of the operational amplifier 27.

A first gating device, shown as a block 47 and labeled "Gate A" is connected in series with the energizing coil 35 of relay $K_1$ and to a terminal 37 of a power supply (not shown) at which a voltage $V_a$ is present. A second gating device, shown as a block 49 and labeled "Gate B" is connected in series with the energizing coil 39 of relay $K_2$ and to power supply terminal 37 at which the voltage $V_a$ is present.

The typical telephone cable pair 11 is assumed to have interference present, which interference is primarily from electric power lines. Such interference is represented in FIG. 1 by a block 41, with coupling to the cable pair 11 indicated by a dotted loop 43.

In operation, the leads 13, 15 of the measuring apparatus having been connected to the cable pair 11 the capacitance of which is to be measured, the Gate A is closed at time $T_1$ (see FIG. 2), energizing relay $K_1$ to close its normally open contact 19. The Gate A remains closed for the entire measurement period, opening at time $T_3$.

The closing of normally open contact 19 of relay $K_1$ completes a circuit from the terminal 45 at which voltage $V_b$ is present, through charging resistance $R_1$ and the normally closed contact 21 of relay $K_2$, to the cable pair 11. The cable pair 11 is then charged until time $T_2$, at which time Gate B closes, energizing relay $K_2$ to open its normally closed contact 21 and close its normally open contact 23. The opening of contact 19, of course, interrupts the charging circuit for the cable pair 11. As shown by FIG. 2, the charge voltage on cable pair 11 (pair voltage) reaches the first predetermined voltage $V_b$ during the time period $T_1 - T_2$. The time period $T_1 - T_2$ is made at least five times the time constant of the charging resistance $R_1$ plus the resistance and capacitance of cable pair 11.

The closing of contact 23 completes a discharge circuit for the cable pair 11 through the discharge resistance $R_2$. At the time $T_3$, Gate B opens, de-energizing relay $K_2$ and causing contact 23 to open, interrupting the discharge circuit. During the time period $T_2 - T_3$, the cable pair discharges to the second predetermined voltage $V_d$. The time period $T_2 - T_3$ is made equal to the period (l/f) of the frequency to be rejected (interference on cable pair 11 due to interference source 41). The time period $T_2 - T_3$ is at least five times the time constant of $R_2$ plus the resistance and capacitance of cable pair 11.

The operational amplifier 27 together with the capacitor $C_1$ forms an integrating circuit which serves to integrate the discharge current, producing at the output terminal 31 of the operational amplifier 27 a voltage $V_c$ which is a linear function of the capacitance of the cable pair 11.

The linear output voltage $V_c$ may be utilized to energize suitable indicator or appraising means (not shown). The indicator or appraising means may display or communicate such items as capacitance, cable pair length, or various types of cable pair faults.

It should be emphasized that the desired result is achieved, that is, the apparatus will have an output that is a linear function of the capacitance measured and will have the property of substantially infinite rejection of a predetermined frequency and its harmonics (interference), and yet have requisite simplicity and economy, only if certain requirements hereinabove set forth are observed. These requirements are (1) the charging resistance is made equal to the discharging resistance; (2) the discharging time is made equal to the period of the interference frequency to be rejected; (3) the charging time is at least five times the time constant of the charging resistance plus the resistance and the capacitance of the selected cable pair; (4) the discharge time is at least five times the time constant of the discharging resistance plus the resistance and capacitance of the selected cable pair.

The following mathematical summary will serve to demonstrate the validity of the emphasis above mentioned. The symbols correspond to those used in FIGS. 1 and 2 of the drawing, except as otherwise noted.

$$V_c = \left(1 - e^{\frac{-t}{R_1 C_x}}\right) \left\{ \frac{C_x}{C_1}(V_b - V_d) + \frac{V_1 R_1 C_x^2 \omega}{1 + (R_1 C_x)^2 \omega^2} - \frac{V_1 R_2 C_x^2 \omega}{1 + (R_2 C_x)^2 \omega^2} \right.$$

$$\left. + \frac{V_1 C_x}{C_1 \sqrt{1 + (R_1 C_x)^2 \omega^2}} [\sin(\omega t_a - \psi) - \sin(\omega t_b - \psi)] \right\}$$

Where
$C_x$ = capacitance of telephone cable pair being measured
$t$ = discharge time $(T_3 - T_2)$
$V_1$ = interference source amplitude
$\omega$ = interference source radian frequency
$\Psi$ = interference source phase
Letting $t >> R_2 C_x$ and $R_1 = R_2$, then:

$$V_c = \frac{C_x}{C_1}(V_b - V_d) + \frac{V_1 C_x}{C_1 \sqrt{1 + (R_1 C_x)^2 \omega^2}}[\sin(\omega t_a - \psi) - \sin(\omega t_b - \psi)]$$

Also, if i t = $t_b - t_a$ (one period of the frequency to be rejected), then:

$$V_c = \frac{C_x}{C_1}(V_b - V_d)$$

Since $V_b - V_d$ = constant, and $C_1$ = constant, then:

$$\frac{V_b - V_d}{C_1} = \text{constant}$$

Representing $$\frac{V_b - V_d}{C_1} \text{ by } K,$$

then:

$$V_c = K C_x$$

In the method context, the invention embodies the method of measuring the capacitance of telephone cable pairs comprising the steps of:
1. selecting a cable pair the capacitance of which is to be measured;
2. charging said cable pair through a charging resistance for a first time period which is at least five times the time constant of said charging resistance plus the resistance and capacitance of said cable pair;
3. beginning at the end of said first time period, discharging said cable pair through a discharging resistance, which has substantially the same value as said charging resistance, for a second time period which is substantially equal to the period of an interference frequency to be rejected and at least five times the time constant of said discharging resistance plus the resistance and capacitance of said cable pair;
4. integrating the discharge current over said second time period;
whereby there is produced an output voltage which is a substantially linear function of the capacitance of said cable pair.

Figure 4:
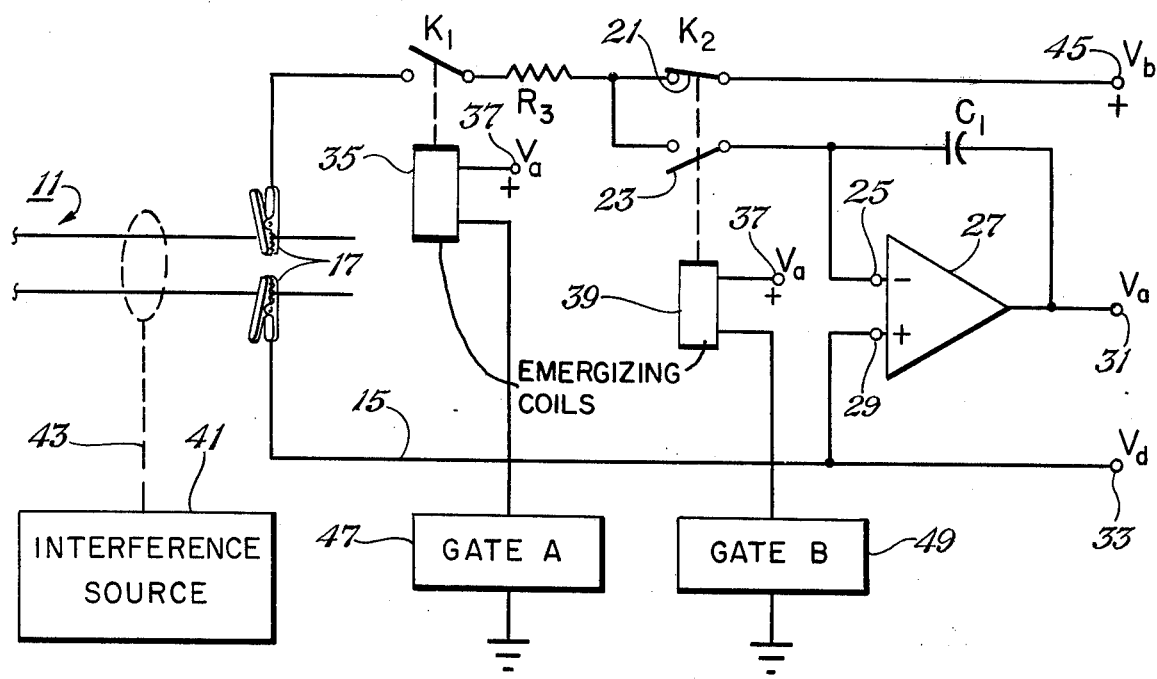
FIG. 4 is a schematic electrical circuit diagram showing apparatus for measuring the capacitance of a telephone cable pair in accordance with a modified form of the invention.

If desired the apparatus can be arranged to employ a single resistance as both the charging and the discharging resistance. To accomplish this in the circuit of FIG. 1, it is only necessary to replace the resistors $R_1$ and $R_2$ with a single resistor $R_3$ which is interposed intermediate the contact 19 of relay $K_1$ and the contacts 21, 23 of relay $K_2$, as shown by FIG. 4.

The measuring apparatus may be connected to the selected cable pair by means of probes which are utilized in apparatus designed for simultaneous splicing and testing, as for example, that disclosed by U.S. Pat. No. 3,755,632.

It is understood that all of the component parts of the apparatus shown by FIG. 1 may be conventional types and consequently need not be shown or described in detail herein. The relays $K_1$ and $K_2$ may be conventional reed or mechanical relays, or they could be semiconductor switches. The gating devices 47, 49 may be conventional type monostable or astable multivibrator devices. The operational amplifier 27 may be of any conventional type suitable for integrator operation. The capacitor $C_1$ should be a low leakage type such as polycarbonate or polystyrene. Typically, $C_1$ may be 0.1 microfarads; $R_1$ and $R_2$ may be 600 ohms; $V_a$ may be 24 volts, unregulated; $V_b$ may be 12 volts, regulated; and $V_d$ may be 6 volts, regulated.

It is further understood that the circuit parameters herein mentioned are not absolutes. For example, ideally, the charging resistance is made precisely equal to the discharging resistance, and the discharge time is made precisely equal to the period of the interference frequency to be rejected; but these parameters could be varied somewhat with attendant departure from idealized performance.

The foregoing disclosure and the showings made in the drawing are merely illustrative of the principles of this invention and are not to be interpreted in a limiting sense.

What is claimed is:

1. Apparatus for measuring the capacitance of telephone cable pairs, comprising:
   a. means for charging through a charging resistance a selected cable pair, the capacitance of which is to be measured, to a first predetermined voltage;
   b. means for discharging said cable pair through a discharge resistance from said first predetermined voltage to a second predetermined voltage;
   c. said charging resistance being substantially equal to said discharge resistance, and the discharge time being substantially equal to a period of an interference frequency to be rejected;
   d. means for integrating the discharge current, whereby there is produced an output voltage which is a substantially linear function of the capacitance of said selected cable pair.

2. The apparatus of claim 1 wherein said charging resistance is also said discharging resistance.

3. The apparatus of claim 1 wherein said charging means includes a first switch means controlled by a first gating device and second switch means controlled by a second gating device, said discharging means includes third switch means controlled by said second gating device, and said integrating means comprises an operational amplifier.

4. Apparatus for measuring the capacitance of telephone cable pairs, comprising:
   a. a charging circuit for connection to a cable pair the capacitance of which is to be measured and including in series a charging resistance, a contact of a first relay and a first contact of a second relay;
   b. a discharging circuit for said cable pair including said first relay contact, a second contact of said second relay, and a discharging resistance having a value substantially equal to that of said charging resistance;
   c. a first gating device for controlling said first relay and a second gating device for controlling said second relay, said first gating device operating to close said first relay contact to initiate charging of said cable pair, said second gating device operating to open said second relay first contact after said cable pair has charged to a predetermined voltage and close said second relay contact to initiate discharge of said cable pair and to maintain said second contact closed for a time period substantially equal to the period of an interference frequency to be rejected;
   d. means for integrating the discharge current, whereby there is produced an output voltage which is a substantially linear function of the capacitance of said selected cable pair.

5. The method of measuring the capacitance of telephone cable pairs comprising the steps of:
   a. selecting a cable pair the capacitance of which is to be measured;
   b. charging said cable pair through a charging resistance for a first time period which is at least five times the time constant of said charging resistance plus the resistance and capacitance of said cable pair;
   c. beginning at the end of said first time period, discharging said cable pair through a discharging resistance, which has substantially the same value as said charging resistance, for a second time period which is substantially equal to the period of an interference frequency to be rejected and at least five times the time constant of said discharging resistance plus the resistance and capacitance of said cable pair
   d. integrating the discharge current over said second time period; whereby there is produced an output voltage which is a substantially linear function of the capacitance of said cable pair.

6. The method of claim 5 wherein said charging resistance is also said discharging resistance.

* * * * *